United States Patent
Childers (10) Patent No.: US 9,388,967 B2
(45) Date of Patent: Jul. 12, 2016

(54) EDGE WEIGHTED SPACING OF LEDS FOR IMPROVED UNIFORMITY RANGE

(71) Applicant: Phoseon Technology, Inc., Hillsboro, OR (US)

(72) Inventor: Doug Childers, Portland, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 0 days.

(21) Appl. No.: 14/947,720

(22) Filed: Nov. 20, 2015

(65) Prior Publication Data

US 2016/0076742 A1   Mar. 17, 2016

Related U.S. Application Data

(63) Continuation of application No. 13/745,129, filed on Jan. 18, 2013.

(60) Provisional application No. 61/588,451, filed on Jan. 19, 2012.

(51) Int. Cl.
| | |
|---|---|
| H05B 37/00 | (2006.01) |
| F21V 15/01 | (2006.01) |
| F21V 23/00 | (2015.01) |
| F21V 29/74 | (2015.01) |
| F21V 29/60 | (2015.01) |
| F21Y 103/00 | (2016.01) |

(52) U.S. Cl.
CPC .............. *F21V 15/01* (2013.01); *F21V 23/009* (2013.01); *F21V 29/60* (2015.01); *F21V 29/74* (2015.01); *F21Y 2103/003* (2013.01)

(58) Field of Classification Search
None
See application file for complete search history.

(56) References Cited

U.S. PATENT DOCUMENTS

| | | | |
|---|---|---|---|
| 8,138,508 B2 * | 3/2012 | Wang | F21K 9/00 257/100 |
| 2006/0071150 A1 * | 4/2006 | Aizpuru | G01D 5/342 250/214.1 |
| 2007/0208395 A1 * | 9/2007 | Leclerc | A61N 5/0616 607/86 |
| 2009/0168419 A1 | 7/2009 | Daimon | |
| 2010/0039817 A1 * | 2/2010 | Wen | F21K 9/00 362/253 |
| 2011/0037411 A1 | 2/2011 | Bonyadi | |

(Continued)

FOREIGN PATENT DOCUMENTS

| | | |
|---|---|---|
| JP | 2009140835 A | 6/2009 |
| JP | 20124024 A | 1/2012 |
| KR | 20110024440 A | 3/2011 |

OTHER PUBLICATIONS

ISA Korean Intellectual Property Office, International Search Report and Written Opinion Issued in Application No. PCT/US2013/022517, May 16, 2013, WIPO, 12 pages.

*Primary Examiner* — Lincoln Donovan
*Assistant Examiner* — Khareem E Almo
(74) *Attorney, Agent, or Firm* — Alleman Hall McCoy Russell & Tuttle LLP (57) ABSTRACT

A light source may comprise a housing, a window mounted in a front plane of the housing, a window length spanning a front plane length, and a linear array of light-emitting elements within the housing. The linear array may be aligned with and emit light through the window, and the linear array may span the window length, wherein first and last light-emitting elements of the linear array are positioned adjacent to widthwise edges of the window, and wherein window sidewalls at the widthwise edges are aligned flush with housing sidewalls.

20 Claims, 8 Drawing Sheets

(56) References Cited

U.S. PATENT DOCUMENTS

2012/0075885 A1* 3/2012 Sampsell .......... G02F 1/133615
362/609

2012/0091923 A1* 4/2012 Kastner-Jung .......... B60Q 7/00
315/360

* cited by examiner

EDGE WEIGHTED SPACING OF LEDS FOR IMPROVED UNIFORMITY RANGE

CROSS REFERENCE TO RELATED APPLICATIONS

This application is a continuation of U.S. Non-Provisional application Ser. No. 13/745,129, entitled "EDGE WEIGHTED SPACING OF LEDS FOR IMPROVED UNIFORMITY RANGE", and filed on Jan. 18, 2013, which claims priority to U.S. Provisional Application No. 61/588,451, entitled "EDGE WEIGHTED SPACING OF LEDS FOR IMPROVED UNIFORMITY RANGE", and filed on Jan. 19, 2012, the entire contents of each of which are hereby incorporated by reference for all purposes.

BACKGROUND AND SUMMARY

Ultraviolet light sources, such as mercury arc lamps and solid-state UV light sources comprising arrays of light-emitting diodes (LEDs) are commonly used for curing in coatings, inks, and adhesives in the imaging, printing, and telecommunication industries. LED technology is replacing traditional mercury arc lamps because they are more energy efficient, last longer, have lower operating temperatures, are safer and more environmentally friendly to use, can be manufactured more compactly, among other reasons.

LEDs and other types of light sources may be characterized as exhibiting a Lambertian or near-Lambertian emission pattern. Accordingly, one challenge with UV curing is providing a uniform irradiance of light across an entire target object or surface. In particular, curing of large two-dimensional surfaces may require manufacture of large light sources that are costly and cumbersome, or may require combining multiple light sources to provide irradiance over the necessary target surface area. The inventor herein has recognized a potential issue with the above approaches. Namely, irradiance uniformity is poor near edges of emission patterns of individual light sources and at junctions between multiple light sources.

One approach that addresses the aforementioned issues includes a light source comprising a housing, a window spanning the length of the housing, and a linear array of light-emitting elements, wherein the light-emitting elements at end portions of the linear array have edge weighted spacing. Furthermore, first and last elements of the linear array of light-emitting elements are positioned adjacent to the sidewalls of a light source housing containing the linear array, wherein the sidewalls of the window and housing are aligned in the same plane. In this manner, emission pattern uniformity of the light source can be enhanced for an individual light source and across multiple light sources as compared to conventional light sources.

It will be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
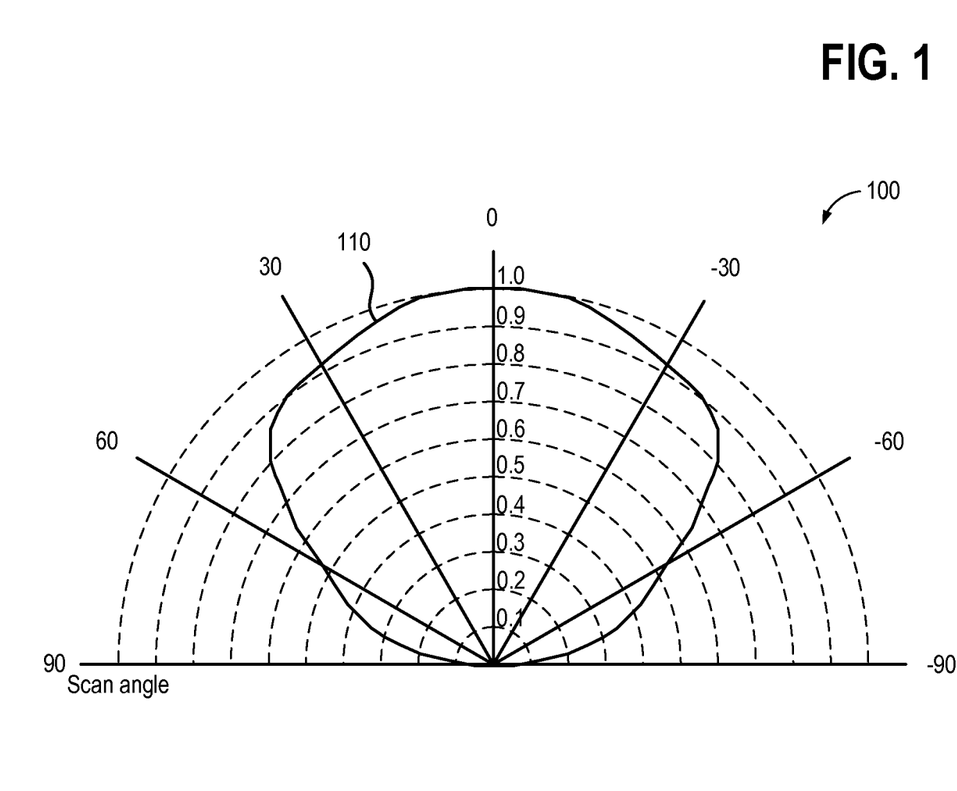
FIG. 1 illustrates an example of a near-Lambertian emission pattern.
Figure 2:
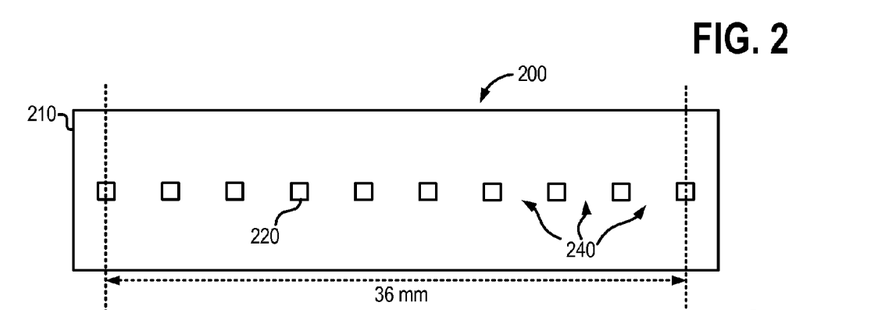
FIG. 2 is a schematic of an example of a regularly spaced linear array of light-emitting elements.
Figure 3:
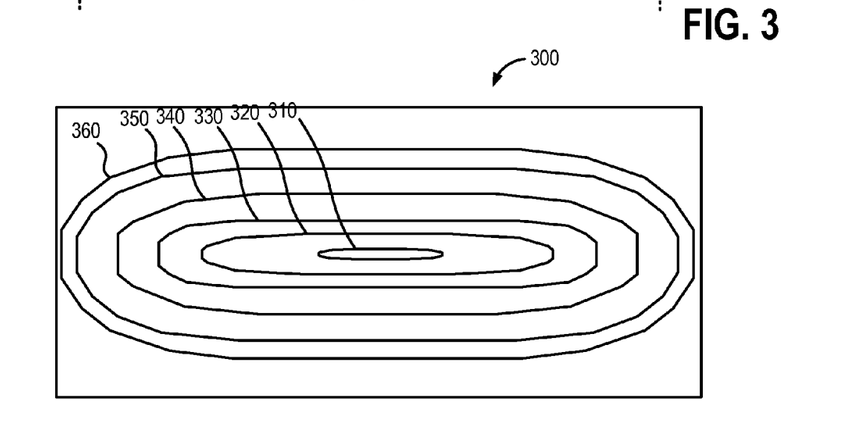
FIG. 3 is a schematic illustrating an irradiance pattern for the regularly spaced linear array of light-emitting elements of FIG. 2.
Figure 4:
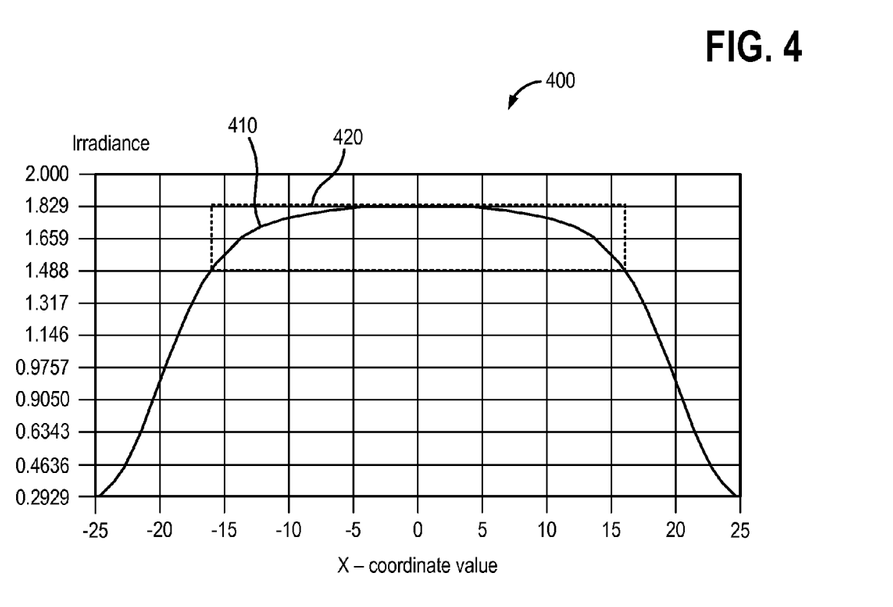
FIG. 4 is a plot showing a cross section of the irradiance pattern of FIG. 3.
Figure 5:
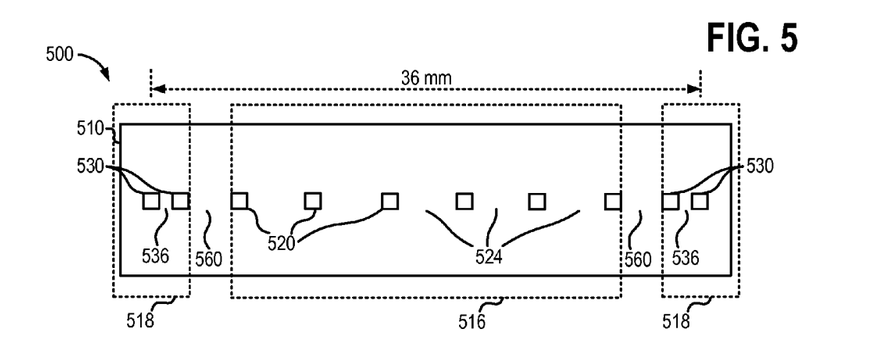
FIG. 5 is a schematic of an example of a linear array of light-emitting elements with edge weighted spacing.
Figure 6:
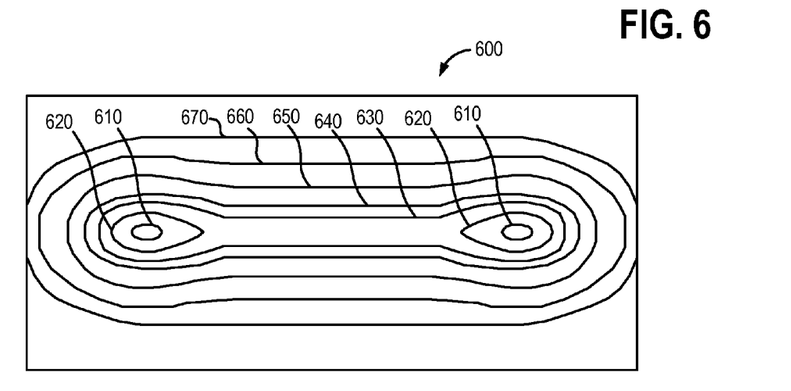
FIG. 6 is a schematic illustrating an irradiance pattern for the edge weighted linear array of light-emitting elements of FIG. 5.
Figure 7:
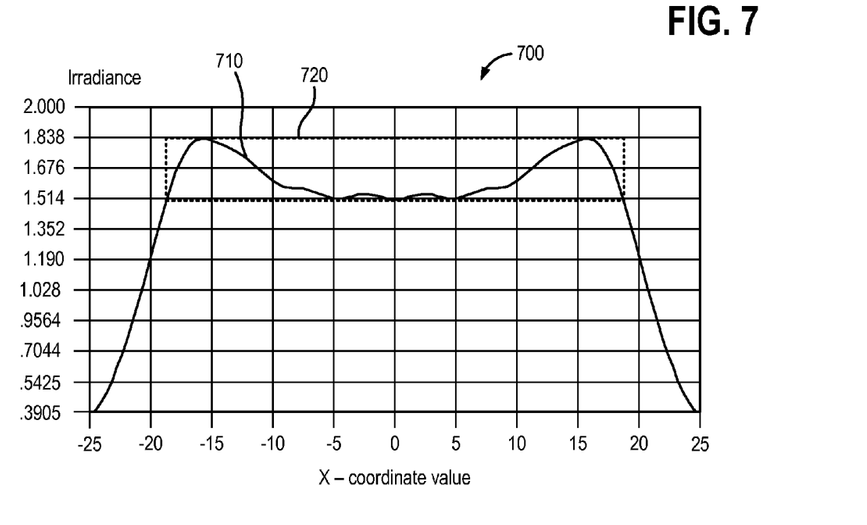
FIG. 7 is a plot showing a cross section of the irradiance pattern of FIG. 6.
Figure 8:
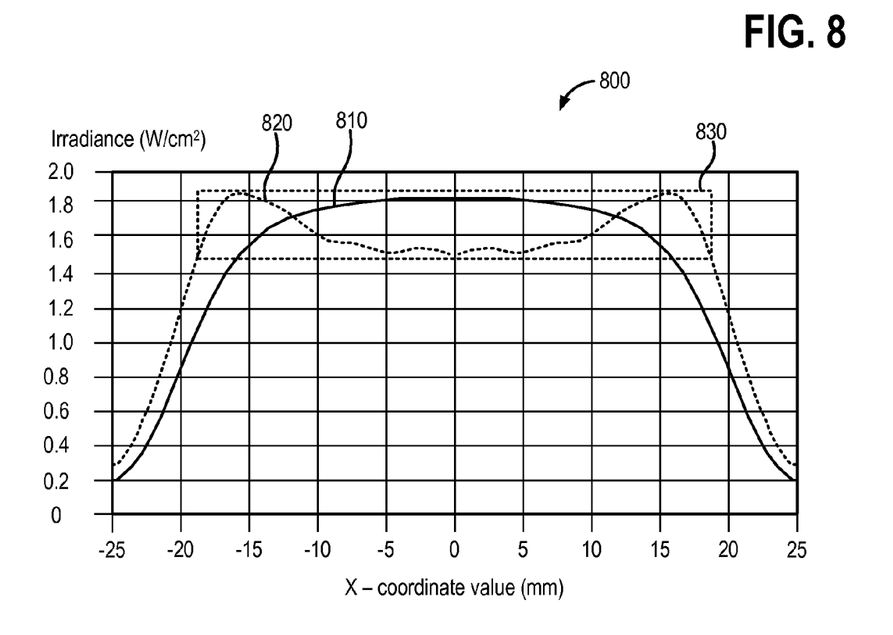
FIG. 8 is a plot of the irradiance profiles of FIG. 4 and FIG. 7.
Figure 9:
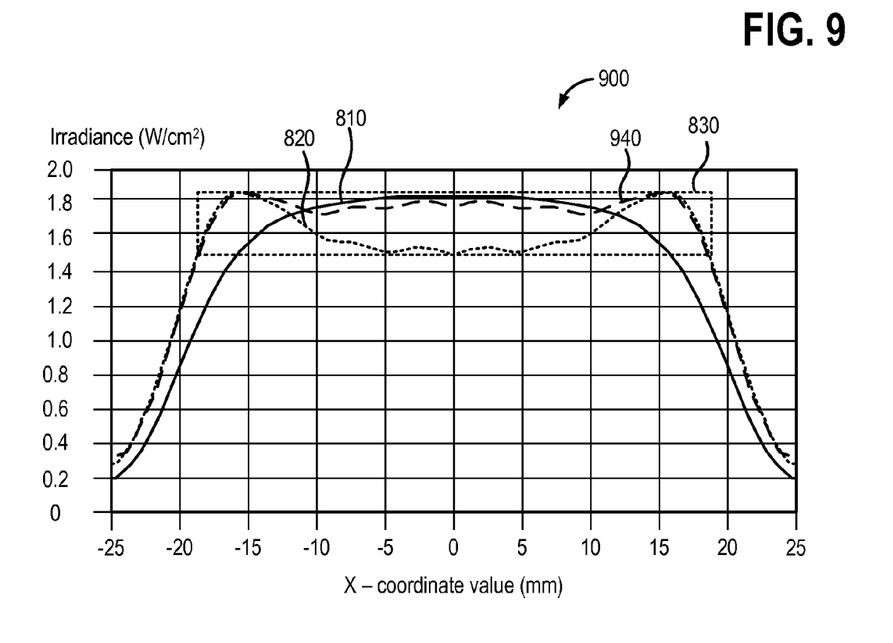
FIG. 9 is a plot of the irradiance profiles of FIG. 4 and FIG. 7, and a plot of the irradiance profile of an edge weighted linear array with interior lensed LEDs.
Figure 10:
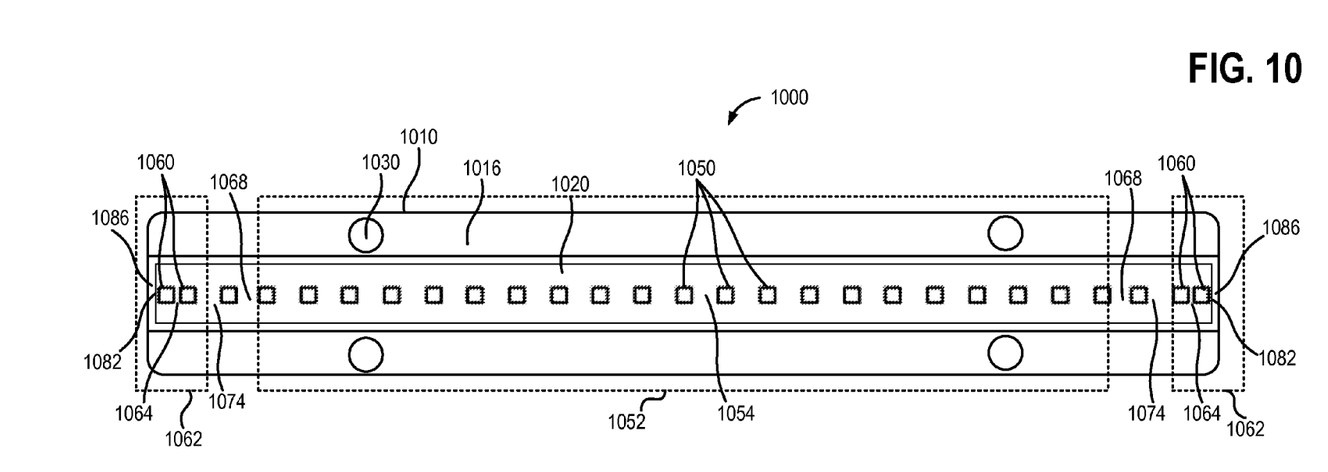
FIG. 10 is a frontal view of an example light source.
Figure 11:
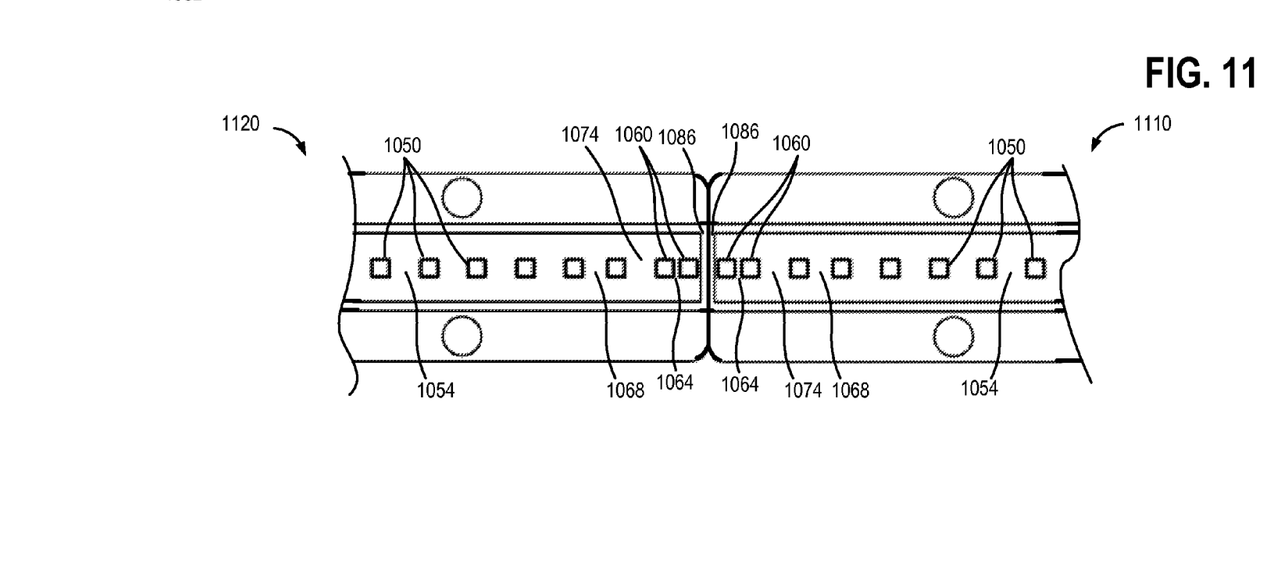
FIG. 11 is a partial frontal view of two of the example light sources of FIG. 10 positioned side by side.
Figure 12:
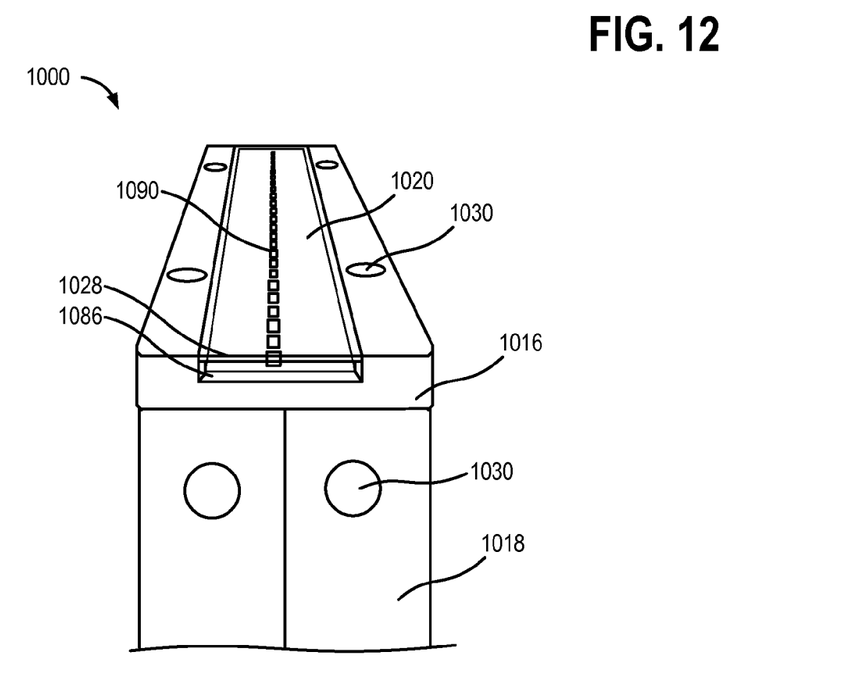
FIG. 12 is a partial side plan view of the example light source of FIG. 10.
Figure 13:
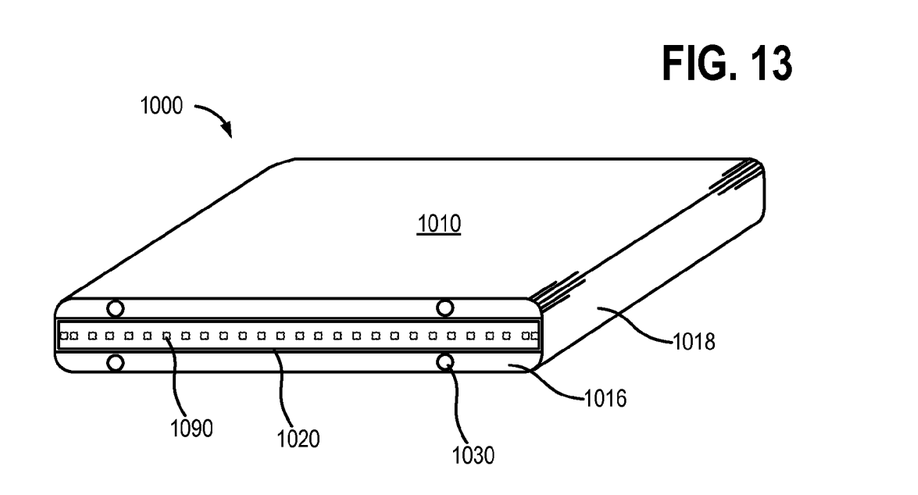
FIG. 13 is a frontal plan view of the example light source of FIG. 10.
Figure 14:
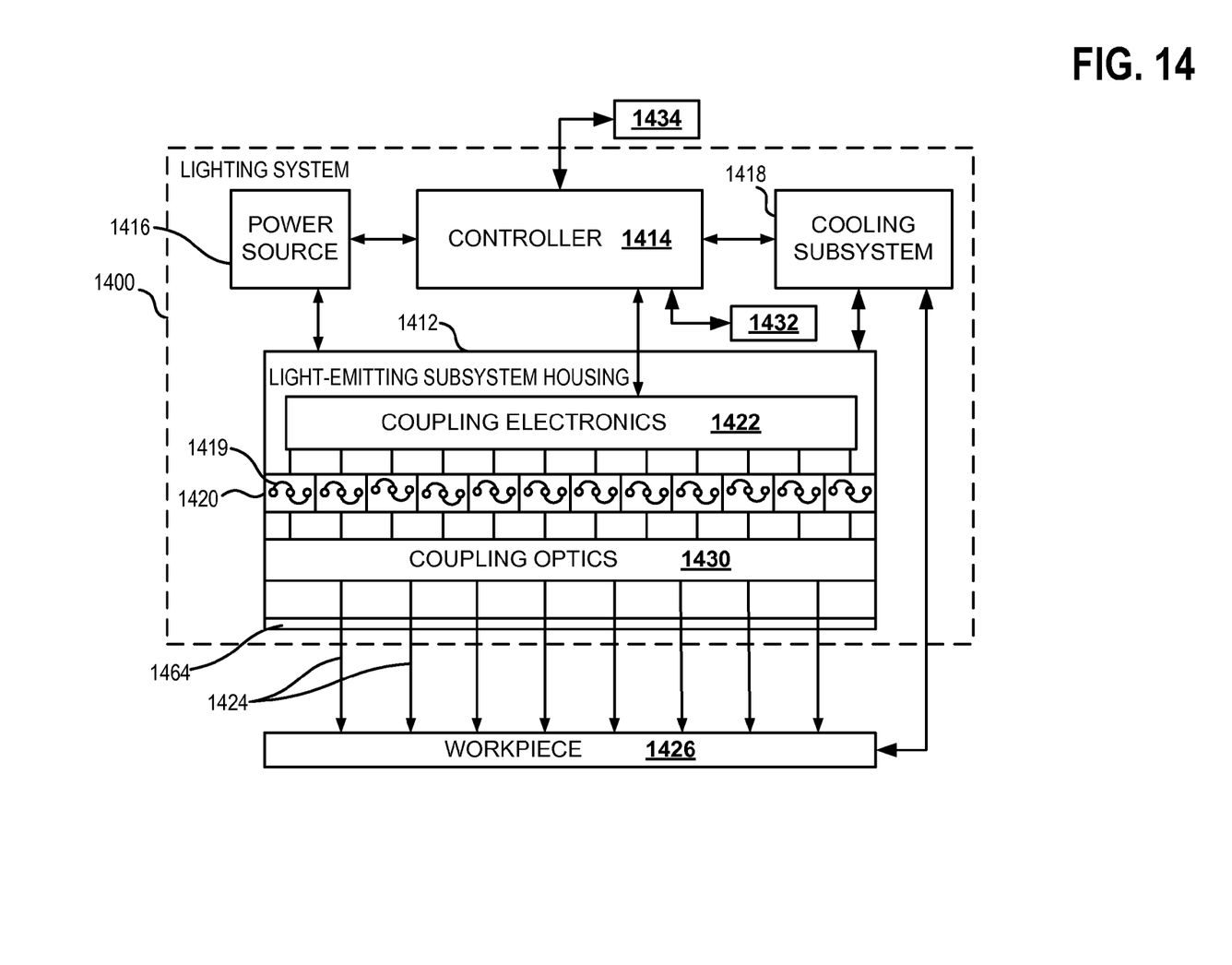
FIG. 14 is a schematic illustrating an example of a lighting system.
Figure 15:
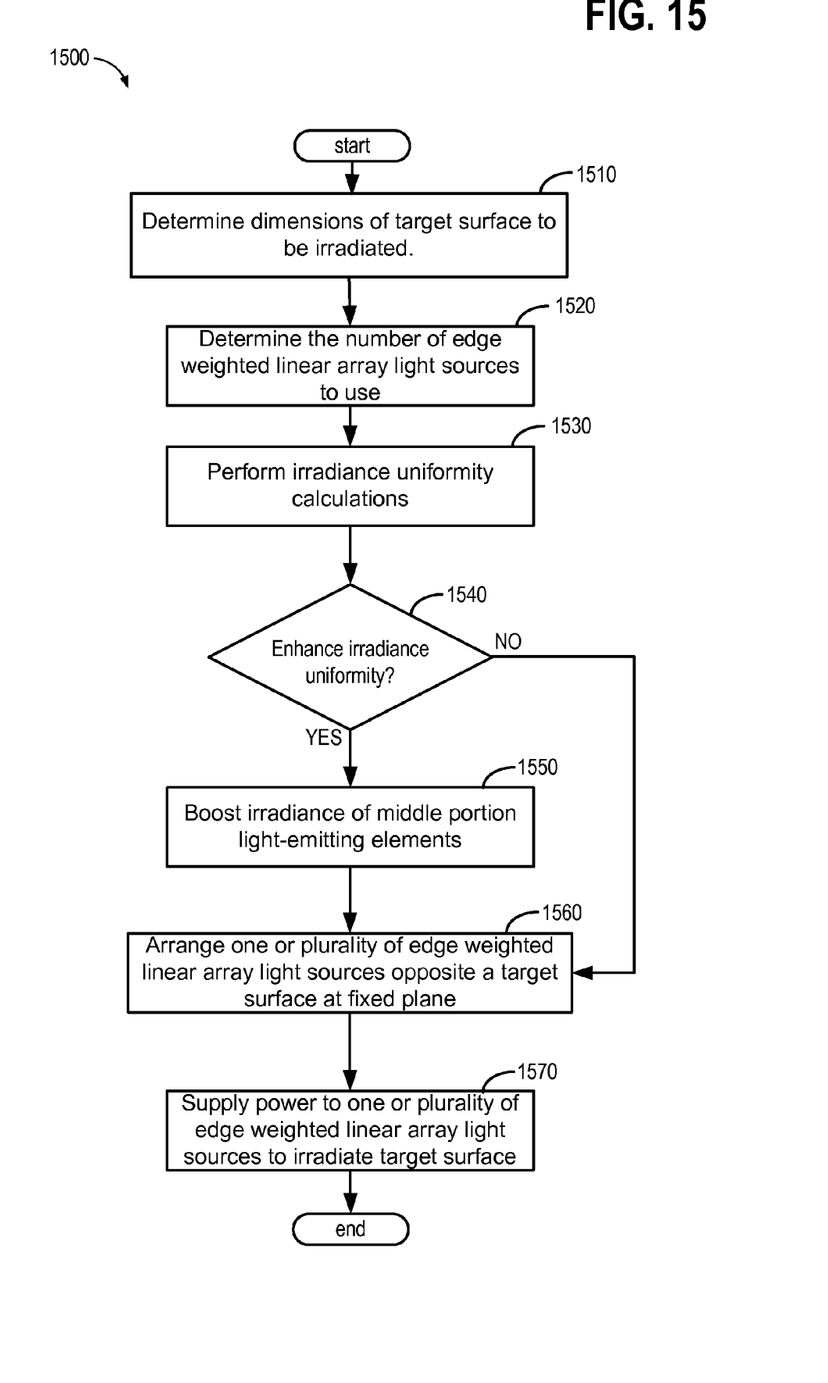
FIG. 15 is an example flow chart for a method of using a light source.

The present description relates to a light source, method of using a light source, and lighting system for use in manufacture of coatings, inks, adhesives, and other curable workpieces. FIG. 1 illustrates an example of a near-Lambertian emission pattern for an LED light-emitting element. FIG. 2 shows a schematic depicting an example of a linear array of light-emitting elements arranged in a regularly spaced manner. FIGS. 3 and 4 illustrate an example of an irradiance pattern and a cross-sectional plot of the irradiance pattern for the regularly spaced linear array of light-emitting elements in FIG. 2. FIG. 5 shows a schematic depicting an example of a linear array of light-emitting elements, wherein the light-emitting elements are distributed with edge weighted spacing. FIGS. 6 and 7 illustrate examples of an irradiance pattern and a cross-sectional plot of the irradiance pattern for the edge weighted linear array of light-emitting elements in FIG. 5. FIGS. 8 and 9 are plots comparing the example irradiance profiles of FIGS. 4 and 7, and comparing the example irradiance profiles FIGS. 4 and 7 and that of edge weighted linear array with interior lensed LEDs. FIG. 10 is a frontal view of an example light source comprising a linear array of edge weighted light-emitting elements, while FIG. 11 illustrates an example of a partial frontal view of two light sources comprising edge weighted linear arrays of light-emitting elements arranged side by side. FIGS. 12 and 13 are a partial side plan view and a frontal plan view of the example light source of FIG. 10. FIG. 14 is a schematic of an example of a configuration for a light source and FIG. 15 is an example flow chart for a method of using a light source.

Turning now to FIG. 1, it illustrates an emission pattern 100 for a near-Lambertian light source such as an LED type light-emitting element. The emission pattern illustrates that the radiant intensity profile 110 is variable as the emission angle from the light source is varied from −90° to +90°. Accordingly, a surface illuminated by a near-Lambertian light source may not be uniformly irradiated with light.

FIG. 2 illustrates a simple schematic of an example of a regularly spaced 36 mm linear array 200 of ten light-emitting elements 220. Regularly spaced implies that the spacing 240 between each light-emitting element may be the same. The light-emitting elements may be mounted on a substrate 210, for example a printed circuit board (PCB).

FIG. 3 illustrates a plot 300 of an irradiance pattern at a fixed plane located 6 mm away from the regularly spaced linear array of LEDs in FIG. 2. The irradiance pattern of plot 300 may be generated using an optical simulation program such as Zemax. Curves 310, 320, 330, 340, 350, and 360 approximate lines of constant irradiance at a surface 6 mm away from the light source oriented perpendicular to the 90° emission angle of 1.80, 1.65, 1.30, 0.90, 0.40, and 0.20 W/cm$^2$ respectively. Irradiance from the regularly spaced array varies across the two dimensional pattern decreasing in intensity from the center of the pattern towards the periphery.

FIG. 4 shows a plot 400 of the cross section of the irradiance pattern of plot 300 taken along its major axis of symmetry, or along a centerline corresponding to the linear array. The irradiance profile 410 illustrates that the irradiance may be somewhat uniform in a central portion of the surface, but may decrease significantly towards the edges. For UV curing, a light source providing uniform irradiance at a target surface may provide uniform curing rates across the target surface. To achieve uniform cure rates, a surface may be irradiated using a light source providing an emission pattern where the irradiance is above a minimum threshold and below a maximum threshold across the target surface. For example, when the irradiance is below a minimum threshold, the cure rate may be slow and curing of the target surface may not be achieved. On the other hand, when the irradiance is above a maximum threshold, curing may proceed too rapidly causing overcuring which may damage the target surface. In general, when the difference between the maximum and minimum thresholds is smaller, more uniform curing rates are achieved. For example, a metric to evaluate uniformity may be defined using Equation (1):

$$\text{Uniformity} = (\text{Maximum} - \text{Minimum})/\text{Average}(\text{Maximum}, \text{Minimum}) \quad (1),$$

wherein Maximum represents the maximum threshold and Minimum represents the minimum threshold irradiance corresponding to providing uniform curing rates. Equation (1) may then be solved for the minimum irradiance given a uniformity and maximum threshold irradiance:

$$\text{Minimum} = \text{Maximum}*(1-\text{Uniformity}/2)/(1+\text{Uniformity}/2) \quad (2)$$

For example, the case where the minimum threshold irradiance is equal to the maximum threshold irradiance corresponds to perfectly uniform irradiance. As a further example, using Equation (2), for a uniformity of 20%, and a maximum irradiance of 1.83 W/cm$^2$, the minimum irradiance is calculated to be 1.497 W/cm$^2$. In this manner, a useable width of the light output at a plane surface 6 mm from the evenly spaced linear array of LEDs of FIG. 2 may be determined from FIG. 4 to be 32.3 mm. The useable width corresponds to the length of the X-coordinate domain of irradiance profile 410 that is within box 420, wherein box 420 represents the X-coordinate values over which the emitted irradiance is between the minimum and maximum threshold values. Thus, over this calculated useable width, the irradiance uniformity may be 20% or less according to Equation (2).

Turning now to FIG. 5, it illustrates an example of a 36 mm linear array 500 of ten light-emitting elements (e.g., LEDs) with edge weighted spacing supported on a substrate 510, such as a PCB. The linear array may comprise a middle portion 516, which contains six LEDs 520 evenly distributed therein with a first spacing 540, and two end portions each comprising two LEDs 530 distributed therein with a second spacing 536. Additionally, a third spacing 560 may be provided between the middle portion 516 and end portions 518. First spacing 524 between light-emitting elements in the middle portion 516 may be larger than second spacing 536 between light-emitting elements in the end portions 518, and third spacing 560 may be smaller than first spacing 524, but larger than second spacing 536. As an example, the edge weighted linear array 500 may be manufactured with the same physical dimensions, may be supplied with the same amount power, and may use the same number and type of light-emitting elements (e.g. LEDs) as evenly spaced linear array 200. In other words, the linear arrays of light-emitting elements 500 and 200 may differ only in their spacing distribution of their light-emitting elements, linear array 200 employing even spacing between all ten light-emitting elements, and linear array 500 employing the above-described edge weighted spacing.

The edge weighted spacing illustrated in FIG. 5 is an example of an edge weighted linear array of light-emitting elements, and is not meant to be limiting. For example, edge weighted linear arrays of light-emitting elements may possess fewer or more than the ten LEDs illustrated in FIGS. 2 and 5. Furthermore, the middle portion of edge weighted linear arrays may comprise a larger or smaller number of LEDs and end portions may comprise a smaller or larger number of LEDs. Further still, the first spacing between light-emitting elements in the middle portion may be larger or smaller than the first spacing 524, the second spacing between light-emitting elements in the end portions may be larger or smaller than second spacing 536, and the third spacing between the middle and end portions may be larger or smaller than third spacing 560. However, edge weighted spacing implies that the second spacing between light-emitting elements in the end portions is smaller than the first spacing between light-emitting elements in the middle portion.

FIG. 6 illustrates a plot 600 of an irradiance pattern at a fixed plane located 6 mm away from the edge weighted linear array of LEDs in FIG. 5. The irradiance pattern of plot 600 may be generated using an optical simulation program such as Zemax. Curves 610, 620, 630, 640, 650, 660 and 670 approximate lines of constant irradiance at a surface 6 mm away from the light source oriented perpendicular to the 90° emission angle of 1.80, 1.65, 1.45, 1.30, 0.90, 0.40, and 0.20 W/cm$^2$ respectively. Irradiance from the edge weighted linear array varies across the two dimensional pattern, decreasing in intensity from the regions encompassed by curves 620 at the center of the pattern outwards towards the periphery.

Turning now to FIG. 7, it shows a plot 700 of the cross section of the irradiance pattern of plot 600 taken along its major axis of symmetry, or along a centerline corresponding to the edge weighted linear array. The irradiance profile 710 illustrates that the irradiance may be somewhat more uniform in a central portion of the surface as compared to the irradiance profile 410 of the evenly spaced linear array, but may also decrease significantly towards the edges of the profile. Using Equation (2) as above, for a uniformity of 20%, and a maximum irradiance of 1.83 W/cm$^2$, the minimum irradiance is calculated to be 1.497 W/cm$^2$. In this manner, a useable width of the light output at a fixed plane located 6 mm from the edge weighted linear array of LEDs of FIG. 5 may be determined from FIG. 7 to be 37.8 mm. The useable width corresponds to the length of the X-coordinate domain of irradiance profile 710 that is within box 720, wherein box 720 represents the X-coordinate values over which the emitted irradiance is between the minimum and maximum threshold values.

Turning now to FIG. 8, it illustrates a plot 800 comparing the irradiance profiles 810 and 820 from FIGS. 4 and 7 of the evenly spaced and edge weighted linear arrays respectively. As shown in FIG. 8, edge weighting the light-emitting elements, for example as in the linear array of FIG. 5, may provide an increase in the useable width light output of 5.5 mm relative to an evenly spaced linear array under the conditions of 20% uniformity corresponding to maximum and minimum threshold irradiances of 1.83 W/cm$^2$ and 1.497 W/cm$^2$ respectively at a fixed plane 6 mm from the light source. Box 830, corresponding to values of the irradiance between the minimum and maximum threshold irradiances, intersects irradiance profile 820 over a longer useable width as compared to irradiance profile 810. Thus by redistributing the light-emitting elements in an evenly spaced linear array to an edge weighted linear array, the uniformity of the light source can be increased while maintaining the dimensions (e.g., overall length) of the linear array and the power supplied to the light source.

Further improvements to the irradiance profile can be made by using LED's of different intensity. For example, higher intensity LEDs may be used in the middle portion (e.g., middle portion 516 in FIG. 5) of the linear array, while lower intensity LEDs may be used in the end portions. Increasing or decreasing the intensity of light from individual light-emitting elements can be achieved by using LEDs from different bins, wherein LEDs from different bins emit light with different intensities, using optical elements such as lenses to refract, reflect and/or diffract the light irradiated from individual light-emitting elements. For example, optical elements may be coupled to the light-emitting elements in the middle portion of the linear array to collimate the light and increase the irradiance of light from those elements. As another example, a diffuser may be coupled to the light-emitting elements in the end portions of the linear array to lower the irradiance of light irradiated from those elements. Furthermore, combinations of optical elements may be coupled to light-emitting elements in the middle and/or end portions to raise or lower the intensity of light irradiated from individual light-emitting elements. In the manners described above, edge weighting of linear arrays of light-emitting elements may thus be achieved through lensing, applying differential power, and by configuring the array with LEDs of different intensity, in addition to the edge weighted spacing previously described and illustrated in FIG. 5.

Turning now to FIG. 9, it illustrates a plot 900 comparing the irradiance profiles 810 and 820 from FIGS. 4 and 7 of the evenly spaced and edge weighted linear arrays respectively. In addition, the irradiance profile 940 of an edge weighted linear array of LEDs similar to array 500, except wherein the four centermost LED elements are lensed to provide a 20% boost in their irradiance, is plotted. As shown in FIG. 9, coupling optical lens elements to the centermost LED elements enhances the uniformity of the linear array of light-emitting elements further, without supplying additional power or increasing the length of the linear array light source.

FIG. 10 illustrates a frontal view of a light source 1000 comprising an edge weighted linear array of twenty-seven light-emitting elements (e.g., LEDs) contained within a housing 1010. Light source 1000 may further comprise a front cover 1016 at the front plane of the housing 1010, a window 1020, and a plurality of fasteners 1030 for fixing the front cover to housing 1010. Housing 1010 and front cover 1016 may be manufactured from a rigid material such as metal, metal allow, plastic, or another material. The light-emitting elements may be mounted on a substrate (not shown), such as a PCB, and the front surface of the substrate may have a reflective coating or surface such that light irradiated from the light-emitting elements onto the substrate front surface is reflected towards the window.

Window 1020 may be transparent to light such as visible light and/or UV light. Window 1020 may thus be constructed from glass, plastic, or another transparent material. Window 1020 may be positioned approximately centrally with respect to the widthwise dimension of the front cover and a length of window 1020 may span the length of the front plane and the front cover 1016 of the housing 1010. Furthermore, window 1020 may be mounted so that its front face (1028 in FIG. 12) is flush with the front cover of the housing 1010, and so that window sidewalls (1086 in FIG. 12) are flush with the housing sidewalls (1018 in FIG. 13) and front cover sidewalls (not shown). In other words, window sidewalls, housing sidewalls, and front cover sidewalls are aligned in the same plane. Window 1020 may serve as a transparent cover for the edge weighted linear array of light-emitting elements contained within the housing, wherein light irradiated from the linear array is transmitted through window 1020 to a target surface, where for example, a curing reaction may be driven.

The linear array of light-emitting elements may be recessed under and approximately centered below window 1020 with respect to the lengthwise and widthwise dimensions of the window. Centering the linear array of light-emitting elements below the window 1020 may help to prevent irradiated light from being blocked by the lengthwise edges of the window where the window meets the front cover.

The edge weighted linear array comprises a middle portion 1052 between two end portions 1062. Middle portion 1052 comprises twenty-one evenly spaced light-emitting elements 1050 distributed with a first spacing 1054, while end portions 1062 each comprise two light-emitting elements 1060 with a second spacing 1064.

Furthermore, light source 1000 may comprise a third spacing 1068 between end portions 1062 and middle portion 1052, wherein the third spacing 1068 is smaller than the first spacing 1054 and larger than the second spacing 1064. Further still, light source 1000 may comprise a fourth spacing 1074 between the end portions 1062 and middle portions 1052.

The edge weighted spacing illustrated in FIG. 10 is an example of an edge weighted linear array of light-emitting elements, and is not meant to be limiting. For example, edge weighted linear arrays of light-emitting elements may possess fewer or more than the twenty-seven LEDs illustrated in FIG. 10. Furthermore, the middle portion of edge weighted linear arrays may comprise a larger or smaller number of LEDs and end portions may comprise a smaller or larger number of LEDs. Further still, the first spacing between light-emitting elements in the middle portion may be larger or smaller than the first spacing 1054, the second spacing between light-emitting elements in the end portions may be larger or smaller than second spacing 1064, and the third spacing between the middle and end portions may be larger or smaller than third spacing 1068. However, edge weighted spacing implies that the second spacing between light-emitting elements in the end portions is smaller than the first spacing between light-emitting elements in the middle portion.

The first and last light-emitting elements in the edge weighted linear array may be positioned directly adjacent to the window sidewalls 1086 of the window 1020. In this manner, the edge weighted linear array of light-emitting elements may span the length of window 1020 and front cover 1016 of housing 1010. As illustrated in FIG. 10, the window sidewalls 1086 may have a thickness wherein the distance from the first or last light-emitting element of the linear array to the external surface of the corresponding window sidewall may be one half or less the first spacing between middle portion light-emitting elements. In some examples a gap 1082 between the window sidewalls and the first and last light-emitting elements in the linear array may exist. Gap 1082 may allow for tolerance stackup and assembly of the light sources.

The light source 1000 may further comprise coupling optics or lensing elements (not shown) positioned between the linear array of light-emitting elements and the window. Coupling optics may serve to at least reflect, refract, collimate and/or diffract irradiated light from the linear array. Coupling optics may also be integrated with window 1020. For example, a diffuser or diffracting layer may be etched or laminated onto the back surface of window 1020 that faces the linear array. Further still, coupling optics may also be integrated into the front surface of window 1020 that faces the target surface.

Turning now to FIG. 11, it illustrates a partial frontal view of two light sources 1110, 1120 arranged side by side. Light sources 1110 and 1120 may each be identical to light source 1000. Thus, light sources 1110, 1120 may each comprise an edge weighted linear array of light-emitting elements. Each linear array comprises light-emitting elements 1050 distributed with a first spacing 1054 in a middle portion, and light-emitting elements 1060 distributed with a second spacing 1064 in end portions. Furthermore, light sources 1110 and 1120 comprise a third spacing 1068 and a fourth spacing 1074 between light-emitting elements 1050, 1060 of the middle and end portions respectively. Third spacing 1068 may be larger than second spacing 1064 and smaller than first spacing 1054. As described above, edge weighting the linear array of light-emitting elements increases the useable width of light output from each light source.

Furthermore, first and last light-emitting elements in the end portions of light sources 1120 and 1110 respectively are positioned adjacent to window sidewalls 1086, wherein the window sidewalls 1086 span the length of the front plane of each light source housing. Positioning the first and last light-emitting elements in the linear arrays adjacent to window sidewalls 1086 may allow low light sources 1120 and 1110 to irradiate light across the entire length of the window. Positioning the first and last light-emitting elements in the linear arrays adjacent to window sidewalls 1086 may comprise positioning the first and last light-emitting elements wherein there may be a small gap 1082 between the window sidewalls and the first and last light-emitting elements respectively.

Further still, the window sidewalls 1086 are flush with the sidewalls of the housings of light sources 1120 and 1110, the window and housing sidewalls extending backward perpendicularly from the front plane of the housing. Aligning the window sidewalls to be flush with the housing sidewalls may reduce spacing between and may maintain continuity of irradiated light across multiple light sources arranged side by side.

In this manner, the total distance from the last light-emitting element of a linear array of light source 1120 to the first light-emitting element of light source 1110 when positioned side by side may be the same or less than the first spacing between middle portion light-emitting elements. Accordingly, for a single light source, the distance from the last light-emitting element of the linear array to the external surface of the corresponding window sidewall may be one half or less the first spacing between middle portion light-emitting elements. Thus, light irradiated from light sources 1120 and 1110 arranged side by side may be more uniform as compared to light irradiated from conventional light sources arranged side by side.

FIG. 12 illustrates a partial side plan view of the light source 1000 of FIG. 10, comprising front cover 1016, window 1020, fasteners 1030 and linear array of light-emitting elements 1090. Window 1020 comprises front face 1028 and window sidewalls 1086. Both window front face 1028 and window sidewalls 1086 are transparent. Accordingly, a portion of light irradiated from end portion light-emitting elements adjacent to and near window sidewalls 1086 may be irradiated through window sidewalls 1086. Irradiation of light through window sidewalls 1086 of light sources may thereby reduce non-uniformities in irradiated light across multiple light sources arranged adjacently side by side as compared to conventional light sources arranged side by side. Window sidewalls 1086 are flush with the sides of front cover 1016 and housing sidewalls 1018 so that light sources can be placed side by side in a flush arrangement wherein a gap between the side by side light sources is reduced. To this end, fasteners 1030 mounted in housing sidewalls 1018 may also be recessed from the plane of housing sidewalls 1018 when fully secured. As previously described, aligning the window sidewalls to be flush with the housing sidewalls may reduce spacing between and may maintain continuity of irradiated light across multiple light sources arranged side by side.

Turning now to FIG. 13, it illustrates a plan view of the example light source 1000 of FIG. 10. The light source comprises a housing 1010 containing a linear array of light-emitting elements, a window and a front cover 1016 at the front plane of the housing 1010, sidewalls 1018, and fasteners 1030. As illustrated, the light source 1000 may have a housing 1010 shaped as a square or rounded rectangular box. Other housing shapes where sidewalls extend backwards perpendicularly from the front plane of the housing and where light sources may be positioned flush when side by side may be used.

In this manner, a light source may comprise a housing, a window mounted in a front plane of the housing, a window length spanning the length of the front plane, and a linear array of light-emitting elements within the housing. The linear array may be aligned with and emit light through the window. Furthermore, the linear array may span the window length, wherein first and last light-emitting elements of the linear array are positioned adjacent to widthwise edges of the window, and wherein window sidewalls at the widthwise edges are aligned flush with housing sidewalls. The window may comprise a front face and the window sidewalls, the front face flush with the front plane, and the window sidewalls extending perpendicularly back from the front plane.

The linear array of light-emitting elements may further comprise a middle portion in between two end portions, the linear array having only a single row of elements. The middle portion may comprise a plurality of light-emitting elements distributed over the middle portion with a first spacing throughout the middle portion, and each of the end portions may comprise a plurality of light-emitting elements distributed over the end portion with a second spacing throughout each end portion. The first spacing may be greater than the second spacing.

The linear array of light-emitting elements may further comprise a third spacing between the middle portion and each of the end portions, wherein the third spacing may be greater than the second spacing and less than the first spacing. The plurality of light-emitting elements in the middle portion may have a first irradiance, and the plurality of light-emitting elements in each end portion may have a second irradiance. Each of the plurality of light-emitting elements in the middle portion may comprise a higher intensity light-emitting element than each of the plurality of light-emitting elements in the end portions, and the first irradiance may be greater than the second irradiance.

Further still, the plurality of light-emitting elements in the middle portion may each comprises an optical element, each optical element increasing a first irradiance of its corresponding light-emitting element, wherein the first irradiance is greater than the second irradiance. Further still, the plurality of light-emitting elements in the end portions may each comprise an optical element, wherein the optical element decreases a second irradiance of its corresponding light-emitting element, and wherein the first irradiance is greater than the second irradiance.

Further still, the plurality of light-emitting elements in the middle portion may be supplied with a first drive current, the plurality of light-emitting elements in the end portions may be supplied with a second drive current, wherein the first drive current may be greater than the second drive current.

Referring now to FIG. 14, it illustrates a block diagram for an example configuration of lighting system 1400. In one example, lighting system 1400 may comprise a light-emitting subsystem 1412, a controller 1414, a power source 1416 and a cooling subsystem 1418. The light-emitting subsystem 1412 may comprise a plurality of semiconductor devices 1419. The plurality of semiconductor devices 1419 may be a linear array 1420 of light-emitting elements such as a linear array of LED devices, for example. Semiconductor devices may provide radiant output 1424. The radiant output 1424 may be directed to a workpiece 1426 located at a fixed plane from lighting system 1400. Furthermore, the linear array of light-emitting elements may be an edge weighted linear array of light-emitting elements, wherein one or more methods are employed to increase the useable width of light output at workpiece 1426. For example, one or more of edge weighted spacing, lensing (e.g. providing coupling optics) of individual light-emitting elements, providing individual light-emitting elements of different intensity, and supplying differential current to individual LEDs may be employed.

The radiant output 1424 may be directed to the workpiece 1426 via coupling optics 1430. The coupling optics 1430, if used, may be variously implemented. As an example, the coupling optics may include one or more layers, materials or other structures interposed between the semiconductor devices 1419 and window 1464, and providing radiant output 1424 to surfaces of the workpiece 1426. As an example, the coupling optics 1430 may include a micro-lens array to enhance collection, condensing, collimation or otherwise the quality or effective quantity of the radiant output 1424. As another example, the coupling optics 1430 may include a micro-reflector array. In employing such a micro-reflector array, each semiconductor device providing radiant output 1424 may be disposed in a respective micro-reflector, on a one-to-one basis. As another example, a linear array of semiconductor devices 1420 providing radiant output 24 and 25 may be disposed in macro-reflectors, on a many-to-one basis. In this manner, coupling optics 1430 may include both micro-reflector arrays, wherein each semiconductor device is disposed on a one-to-one basis in a respective micro-reflector, and macro-reflectors wherein the quantity and/or quality of the radiant output 1424 from the semiconductor devices is further enhanced by macro-reflectors.

Each of the layers, materials or other structure of coupling optics 1430 may have a selected index of refraction. By properly selecting each index of refraction, reflection at interfaces between layers, materials and other structures in the path of the radiant output 1424 may be selectively controlled. As an example, by controlling differences in such indexes of refraction at a selected interface, for example window 1464, disposed between the semiconductor devices to the workpiece 1426, reflection at that interface may be reduced or increased so as to enhance the transmission of radiant output at that interface for ultimate delivery to the workpiece 1426. For example, the coupling optics may include a dichroic reflector where certain wavelengths of incident light are absorbed, while others are reflected and focused to the surface of workpiece 1426.

The coupling optics 1430 may be employed for various purposes. Example purposes include, among others, to protect the semiconductor devices 1419, to retain cooling fluid associated with the cooling subsystem 1418, to collect, condense and/or collimate the radiant output 1424, or for other purposes, alone or in combination. As a further example, the lighting system 1400 may employ coupling optics 1430 so as to enhance the effective quality, uniformity, or quantity of the radiant output 1424, particularly as delivered to the workpiece 1426.

Selected of the plurality of semiconductor devices 1419 may be coupled to the controller 1414 via coupling electronics 1422, so as to provide data to the controller 1414. As described further below, the controller 1414 may also be implemented to control such data-providing semiconductor devices, e.g., via the coupling electronics 1422. The controller 1414 may be connected to, and may be implemented to control, the power source 1416, and the cooling subsystem 1418. For example, the controller may supply a larger drive current to light-emitting elements distributed in the middle portion of linear array 1420 and a smaller drive current to light-emitting elements distributed in the end portions of linear array 1420 in order to increase the useable width of light irradiated at workpiece 1426. Moreover, the controller 1414 may receive data from power source 1416 and cooling subsystem 1418. In one example, the irradiance at one or more locations at the workpiece 1426 surface may be detected by sensors and transmitted to controller 1414 in a feedback control scheme. In a further example, controller 1414 may communicate with a controller of another lighting system (not shown in FIG. 14) to coordinate control of both lighting systems. For example, controllers 1414 of multiple lighting systems may operate in a master-slave cascading control algorithm, where the setpoint of one of the controllers is set by the output of the other controller. Other control strategies for operation of lighting system 10 in conjunction with another lighting system may also be used. As another example, controllers 1414 for multiple lighting systems arranged side by side may control lighting systems in an identical manner for increasing uniformity of irradiated light across multiple lighting systems.

In addition to the power source 1416, cooling subsystem 1418, and light-emitting subsystem 1412, the controller 1414 may also be connected to, and implemented to control internal element 1432, and external element 1434. Element 1432, as shown, may be internal to the lighting system 1410, while element 1434, as shown, may be external to the lighting system 1410, but may be associated with the workpiece 1426 (e.g., handling, cooling or other external equipment) or may be otherwise related to a photoreaction (e.g. curing) that lighting system 1410 supports.

The data received by the controller 1414 from one or more of the power source 1416, the cooling subsystem 1418, the light-emitting subsystem 1412, and/or elements 1432 and 1434, may be of various types. As an example the data may be representative of one or more characteristics associated with coupled semiconductor devices 1419. As another example, the data may be representative of one or more characteristics associated with the respective light-emitting subsystem 1412, power source 1416, cooling subsystem 1418, internal element 1432, and external element 1434 providing the data. As still another example, the data may be representative of one or more characteristics associated with the workpiece 1426 (e.g., representative of the radiant output energy or spectral component(s) directed to the workpiece). Moreover, the data may be representative of some combination of these characteristics.

The controller 1414, in receipt of any such data, may be implemented to respond to that data. For example, responsive to such data from any such component, the controller 1414 may be implemented to control one or more of the power source 1416, cooling subsystem 1418, light-emitting subsystem 1412 (including one or more such coupled semiconductor devices), and/or the elements 32 and 34. As an example, responsive to data from the light-emitting subsystem indicating that the light energy is insufficient at one or more points associated with the workpiece, the controller 1414 may be implemented to either (a) increase the power source's supply of power to one or more of the semiconductor devices, (b) increase cooling of the light-emitting subsystem via the cooling subsystem 1418 (e.g., certain light-emitting devices, if cooled, provide greater radiant output), (c) increase the time during which the power is supplied to such devices, or (d) a combination of the above.

Individual semiconductor devices 1419 (e.g., LED devices) of the light-emitting subsystem 1412 may be controlled independently by controller 1414. For example, controller 1414 may control a first group of one or more individual LED devices to emit light of a first intensity, wavelength, and the like, while controlling a second group of one or more individual LED devices to emit light of a different intensity, wavelength, and the like. The first group of one or more individual LED devices may be within the same linear array 1420 of semiconductor devices, or may be from more than one linear array of semiconductor devices 1420 from multiple lighting systems 1400. Linear array 1420 of semiconductor device may also be controlled independently by controller 1414 from other linear arrays of semiconductor devices in other lighting systems. For example, the semiconductor devices of a first linear array may be controlled to emit light of a first intensity, wavelength, and the like, while those of a second linear array in another lighting system may be controlled to emit light of a second intensity, wavelength, and the like.

As a further example, under a first set of conditions (e.g. for a specific workpiece, photoreaction, and/or set of operating conditions) controller 1414 may operate lighting system 1410 to implement a first control strategy, whereas under a second set of conditions (e.g. for a specific workpiece, photoreaction, and/or set of operating conditions) controller 1414 may operate lighting system 1410 to implement a second control strategy. As described above, the first control strategy may include operating a first group of one or more individual semiconductor devices (e.g., LED devices) to emit light of a first intensity, wavelength, and the like, while the second control strategy may include operating a second group of one or more individual LED devices to emit light of a second intensity, wavelength, and the like. The first group of LED devices may be the same group of LED devices as the second group, and may span one or more arrays of LED devices, or may be a different group of LED devices from the second group, but the different group of LED devices may include a subset of one or more LED devices from the second group.

The cooling subsystem 1418 may be implemented to manage the thermal behavior of the light-emitting subsystem 1412. For example, the cooling subsystem 1418 may provide for cooling of light-emitting subsystem 1412, and more specifically, the semiconductor devices 1419. The cooling subsystem 1418 may also be implemented to cool the workpiece 1426 and/or the space between the workpiece 1426 and the lighting system 1410 (e.g., the light-emitting subsystem 1412). For example, cooling subsystem 1418 may comprise an air or other fluid (e.g., water) cooling system. Cooling subsystem 1418 may also include cooling elements such as cooling fins attached to the semiconductor devices 1419, or linear array 1420 thereof, or to the coupling optics 1430. For example, cooling subsystem may include blowing cooling air over the coupling optics 1430, wherein the coupling optics 1430 are equipped with external fins to enhance heat transfer.

The lighting system 1410 may be used for various applications. Examples include, without limitation, curing applications ranging from ink printing to the fabrication of DVDs and lithography. The applications in which the lighting system 1410 may be employed can have associated operating parameters. That is, an application may have associated operating parameters as follows: provision of one or more levels of radiant power, at one or more wavelengths, applied over one or more periods of time. In order to properly accomplish the photoreaction associated with the application, optical power may be delivered at or near the workpiece 1426 at or above one or more predetermined levels of one or a plurality of these parameters (and/or for a certain time, times or range of times).

In order to follow an intended application's parameters, the semiconductor devices 1419 providing radiant output 1424 may be operated in accordance with various characteristics associated with the application's parameters, e.g., temperature, spectral distribution and radiant power. At the same time, the semiconductor devices 1419 may have certain operating specifications, which may be associated with the semiconductor devices' fabrication and, among other things, may be followed in order to preclude destruction and/or forestall degradation of the devices. Other components of the lighting system 1410 may also have associated operating specifications. These specifications may include ranges (e.g., maximum and minimum) for operating temperatures and applied electrical power, among other parameter specifications.

Accordingly, the lighting system 1410 may support monitoring of the application's parameters. In addition, the lighting system 1410 may provide for monitoring of semiconductor devices 1419, including their respective characteristics and specifications. Moreover, the lighting system 1410 may also provide for monitoring of selected other components of the lighting system 1410, including its characteristics and specifications.

Providing such monitoring may enable verification of the system's proper operation so that operation of lighting system 1410 may be reliably evaluated. For example, lighting system 1410 may be operating improperly with respect to one or more of the application's parameters (e.g. temperature, spectral distribution, radiant power, and the like), any component's characteristics associated with such parameters and/or any component's respective operating specifications. The provision of monitoring may be responsive and carried out in accordance with the data received by the controller 1414 from one or more of the system's components.

Monitoring may also support control of the system's operation. For example, a control strategy may be implemented via the controller 1414, the controller 1414 receiving and being responsive to data from one or more system components. This control strategy, as described above, may be implemented directly (e.g., by controlling a component through control signals directed to the component, based on data respecting that components operation) or indirectly (e.g., by controlling a component's operation through control signals directed to adjust operation of other components). As an example, a semiconductor device's radiant output may be adjusted indirectly through control signals directed to the power source 1416 that adjust power applied to the light-emitting subsystem 1412 and/or through control signals directed to the cooling subsystem 1418 that adjust cooling applied to the light-emitting subsystem 1412.

Control strategies may be employed to enable and/or enhance the system's proper operation and/or performance of the application. In a more specific example, control may also be employed to enable and/or enhance balance between the linear array's radiant output and its operating temperature, so as, e.g., to preclude heating the semiconductor devices 1419 beyond their specifications while also directing sufficient radiant energy to the workpiece 1426, for example, to carry out a photoreaction of the application.

In some applications, high radiant power may be delivered to the workpiece 1426. Accordingly, the light-emitting subsystem 1412 may be implemented using a linear array of light-emitting semiconductor devices 1420. For example, the light-emitting subsystem 1412 may be implemented using a high-density, light-emitting diode (LED) array. Although LED arrays may be used and are described in detail herein, it is understood that the semiconductor devices 1419, and linear arrays 1420 thereof, may be implemented using other light-emitting technologies without departing from the principles of the invention; examples of other light-emitting technologies include, without limitation, organic LEDs, laser diodes, other semiconductor lasers.

In this manner, a lighting system may comprise a power supply, a cooling subsystem, and a light-emitting subsystem. The light-emitting subsystem may comprise a housing, a window mounted in a front plane of the housing, a window length spanning a front plane length, and a linear array of light-emitting elements contained within the housing. The linear array may be aligned with and emit light through the window, and the linear array may span the window length, wherein first and last light-emitting elements of the linear array may be positioned adjacent to widthwise edges of the window. Window sidewalls at the widthwise edges may be aligned flush with housing sidewalls, the window sidewalls extending perpendicularly back from the front plane.

Further still, the linear array of light-emitting elements may comprise a middle portion in between two end portions, the linear array having only a single row of elements. The middle portion may comprise a plurality of light-emitting elements distributed over the middle portion with a first spacing throughout the middle portion; and each of the end portions may comprise a plurality of light-emitting elements distributed over the end portion with a second spacing throughout each end portion, the first spacing greater than the second spacing.

The lighting system may further comprise a controller, including instructions executable to irradiate light from the light-emitting elements distributed over the middle portion having a first irradiance, and to irradiate light from light-emitting elements distributed over the end portions having a second irradiance, wherein the first irradiance is greater than the second irradiance. Furthermore, the lighting system may comprise coupling optics, the coupling optics comprising first optical elements at each of the plurality of light-emitting elements in the middle portion and second optical elements at each of the plurality of light-emitting elements in the end portions. The cooling subsystem may comprise a heat sink with cooling fins conductively attached to a back surface of the linear array of light-emitting elements, and a cooling fan.

Turning now to FIG. 15, it illustrates a flow chart for an example method 1500 of irradiating a target surface. Method 1500 begins at 1510 where the dimensions of the target surface to be irradiated are determined. The target surface may comprise a portion of a surface or an entire surface. The target surface may further comprise a portion of a surface or object to be uniformly irradiated. For example, a first portion of the target surface may be cured with enhanced irradiance uniformity (e.g., uniformity determined using Equations (1) and (2)) and a second portion of the target surface may be cured with a non-enhanced irradiance uniformity. As an example, the first portion may be a central portion, and the second portion may be a periphery portion. In other examples the first and second portions may be a left and right side portion, and other apportioning schemes may be used as appropriate to the target surface to be irradiated.

Continuing at 1520, the number of edge weighted linear array light sources is determined. For example, one or a plurality of edge weighed linear array light sources arranged side by side may be used to irradiate the target surface. The number of light sources may be determined based one or more factors including the dimensions of the target surface to be irradiated, the irradiance pattern of the one or plurality of light sources, the dimension of the light sources, the power supplied to the light sources, and the target surface exposure time, among other factors. For example if the length of the target surface is very long, multiple light sources arranged side by side may be used to irradiate the entire length of the target surface.

Next, method 1500 continues at 1530 where irradiance uniformity calculations may be performed. The uniformity calculations may be calculated using Equation (1) and (2) as well as knowledge of the irradiance patterns and irradiance profiles of the light sources. For example, irradiance patterns and irradiance profiles may be predetermined based on sensor measurements and/or optical simulations. Furthermore, using Equation (2), a maximum irradiance, and a predetermined uniformity level, a minimum irradiance intensity may be calculated for irradiance of a target surface at a fixed plane located at specific distance from the one or more light sources. Further still, performing uniformity calculations may include toggling one or more of the power supplied to the light source, the maximum irradiance emitted from the light source, the distance of the target surface from the light source, the irradiance exposure time, and other factors. For example, positioning the target surface at a fixed plane closer to one or more light sources may increase the area of the target surface meeting a specific irradiance uniformity, however, maximum irradiance levels at the closer fixed plane may exceed a maximum irradiance threshold. Consequently, the power supplied to the one or more light sources may be reduced to lower the maximum irradiance threshold while maintaining the same irradiance uniformity.

Method 1500 continues at 1540 where it is determined if irradiance uniformity is to be enhanced. For example, based on 1520 and 1530, it may be determined that irradiance uniformity is to be enhanced in order to irradiate a target surface with a predetermined irradiance uniformity within a predetermined irradiance exposure time. For example, a predetermined irradiance exposure time may correspond to a specified cure rate or curing time of a curing reaction at the target surface that is to be driven by the irradiated light. As another example, irradiation uniformity may be enhanced to provide uniform irradiance above a minimum irradiance threshold.

If it is determined that irradiance uniformity is to be enhanced, method 1500 continues at 1550, where the irradiance of middle portion light-emitting elements of the one or more edge weighted linear array light sources may be boosted. For example, boosting may comprise one or more of using higher intensity light-emitting elements (e.g., LEDs) in the middle portion of edge weighted the linear array light sources, using lower intensity light-emitting elements in the end portions of edge weighted the linear array light sources, integrating lens elements or other optical elements with the linear array light-emitting elements, or supplying light-emitting elements individually with different drive currents. For example, boosting irradiance of the middle portion light-emitting elements may comprise supplying additional drive current to the middle portion light-emitting elements, or supplying lower drive current to the end portion light-emitting elements. As another example, boosting irradiance of the middle portion light-emitting elements may comprise lensing the middle portion light-emitting elements to collimate irradiated light therefrom and/or supplying additional drive current to the middle portion light-emitting elements. Other methods and combinations of boosting the irradiance of middle portion light-emitting elements may be used to enhance irradiance uniformity.

Next, method 1500 continues at 1560 where one or a plurality of edge weighted linear array light sources are arranged side by side opposite a target surface at a fixed plane. The distance of the fixed plane from the one or more light sources may be determined based on one or more of 1520, 1530, 1540, and 1550 wherein arranging the target surface at the fixed plane opposite the one or more light sources can achieve uniform irradiance of the target surface.

Method 1500 continues at 1570 where power is supplied to the one or plurality of edge weighted linear array light sources to irradiate the target surface. Supplying power to the one or plurality of edge weighted linear array light sources may include supplying additional drive current to the middle portion light-emitting elements, or supplying lower drive current to the end portion light-emitting elements in order to enhance irradiance uniformity as in 1540 and 1550. Supplying power to the one or plurality of edge weighted linear array light sources may further comprise supplying power for a predetermined length of time or as prescribed by a controller control scheme. For example, one or more controllers (e.g., 1414) may supply power to the one or plurality of edge weighted linear array light sources to irradiate the target surface according to a feedback control scheme. Other examples of control schemes are described above in reference to FIG. 14. After 1570, method 1500 ends.

In this manner, a method of irradiating light may comprise irradiating light from a linear array of light-emitting elements, the linear array of light-emitting elements comprising a middle portion in between two end portions, the linear array having only a single row of elements. The middle portion may comprise a plurality of light-emitting elements distributed over the middle portion with a first spacing throughout the middle portions, and each of the end portions may comprise a plurality of light-emitting elements distributed over the end portion with a second spacing throughout each end portion, wherein the first spacing is greater than the second spacing. A third spacing between the middle portion and each of the end portions may be greater than the second spacing and less than the first spacing.

Furthermore, the plurality of light-emitting elements in the middle portion may have a first irradiance, and the plurality of light-emitting elements in each end portion may have a second irradiance. Light irradiated from the plurality of light-emitting elements distributed over the middle portion may have a first intensity, and light irradiated from light-emitting elements distributed over the end portions may have a second intensity, wherein the first intensity is greater than the second intensity.

Further still, a first drive current may be supplied to each of the plurality of light-emitting elements in the middle portion, and a second drive current may be supplied to each of the plurality of light-emitting elements in the end portions, wherein the first drive current is greater than the second drive current, and the first irradiance is greater than the second irradiance.

Further still, the method may comprise one or more of reflecting, refracting, and diffracting light from each of the plurality of light-emitting elements in the middle portion via optical elements, wherein each of the plurality of light-emitting elements in the middle portion comprises one of the optical elements, and wherein the first irradiance is greater than the second irradiance. The method may further comprise one or more of reflecting, refracting, and diffracting light from each of the plurality of light-emitting elements in the end portions via optical elements, wherein each of the plurality of light-emitting elements in the end portions comprises one of the optical elements, and wherein the first irradiance is greater than the second irradiance.

It will be appreciated that the configurations disclosed herein are exemplary in nature, and that these specific embodiments are not to be considered in a limiting sense, because numerous variations are possible. For example, the above embodiments can be applied to workpieces such as inks, coated surfaces, adhesives, optical fibers, cables, and ribbons. Furthermore, the light sources and lighting systems described above may be integrated with existing manufacturing equipment and are not designed for a specific type of light engine. As described above, any suitable light engine may be used such as a microwave-powered lamp, LED's, LED arrays, and mercury arc lamps. The subject matter of the present disclosure includes all novel and non-obvious combinations and subcombinations of the various configurations, and other features, functions, and/or properties disclosed herein.

Note that the example process flows described herein can be used with various lighting sources and lighting system configurations. The process flows described herein may represent one or more of any number of processing strategies such as continuous, batch, semi-batch, and semi-continuous processing, and the like. As such, various acts, operations, or functions illustrated may be performed in the sequence illustrated, in parallel, or in some cases omitted. Likewise, the order of processing is not necessarily called for to achieve the features and advantages of the example embodiments described herein, but is provided for ease of illustration and description. One or more of the illustrated acts or functions may be repeatedly performed depending on the particular strategy being used. It will be appreciated that the configurations and routines disclosed herein are exemplary in nature, and that these specific embodiments are not to be considered in a limiting sense, because numerous variations are possible. The subject matter of the present disclosure includes all novel and non-obvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims are to be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A light source, comprising:
   a housing;
   a window mounted in a front plane of the housing, a window length spanning a length of the front plane; and
   a linear array of light-emitting elements enclosed within the housing and the window, the linear array aligned with and emitting light through a window front plane and window sidewalls, and the linear array spanning the window length, wherein first and last light-emitting elements of the linear array are positioned adjacent to widthwise edges of the window, and wherein the window sidewalls at the widthwise edges are aligned flush with housing sidewalls.

2. The light source of claim 1, wherein the length of the front plane comprises an entire length of the front plane of the housing.

3. The light source of claim 1, wherein the linear array of light-emitting elements comprises more than one light-emitting element.

4. The light source of claim 1, wherein the window comprises a contiguous window covering the linear array of light-emitting elements through which the linear array of light-emitting elements emit light.

5. The light source of claim 4, wherein the linear array of light-emitting elements are recessed below the contiguous window covering.

6. The light source of claim 1, wherein the linear array of light-emitting elements further comprises a middle portion in between two end portions, the linear array having only a single row of elements, wherein:
   the middle portion comprises a plurality of light-emitting elements evenly distributed over the middle portion with a first spacing throughout the middle portion;
   each of the end portions comprise a plurality of light-emitting elements evenly distributed over the end portion with a second spacing throughout the end portion, the first spacing greater than the second spacing; and
   the middle portion and the two end portions comprise all of the light-emitting elements in the linear array.

7. The light source of claim 6, wherein the middle portion comprises four light-emitting elements.

8. The light source of claim 6, wherein a third spacing between the middle portion and each of the two end portions is greater than the second spacing and less than the first spacing.

9. The light source of claim 6, wherein:
   the plurality of light-emitting elements in the middle portion have a first irradiance; and
   the plurality of light-emitting elements in each end portion have a second irradiance.

10. A method of irradiating light, comprising:
    irradiating light from a linear array of light-emitting elements through a front plane and sidewalls of a window, wherein:
       the window is mounted in a front plane of a housing, a window length spanning a length of the front plane;
       the housing and the window enclose the linear array of light-emitting elements; and
       the linear array of light-emitting elements spans the window length, wherein first and last light-emitting elements of the linear array of light-emitting elements are positioned adjacent to widthwise edges of the window, and wherein the window sidewalls at the widthwise edges are aligned flush with housing sidewalls.

11. The method of irradiating light of claim 10, wherein irradiating light from the linear array of light-emitting elements comprises irradiating light with a first irradiance from a plurality of light-emitting elements in a middle portion of the linear array and irradiating light with a second irradiance from a plurality of light-emitting elements in two end portions of the linear array, wherein,
    the linear array of light-emitting elements comprises the middle portion in between the two end portions, the linear array having a single row of elements, wherein,
    the middle portion comprises a plurality of light-emitting elements of the linear array evenly distributed over the middle portion with a first spacing throughout the middle portion, and
    each of the end portions comprises a plurality of light-emitting elements of the linear array evenly distributed over the end portion with a second spacing throughout the end portion, the first spacing being greater than the second spacing, and the middle portion and the two end portions comprise all of the light-emitting elements in the linear array.

12. The method of claim 11, wherein irradiating light from the linear array of light-emitting elements further comprises irradiating light from the plurality of light-emitting elements distributed over the middle portion with a first intensity, and irradiating light from light-emitting elements distributed over the two end portions with a second intensity, wherein the first intensity is greater than the second intensity.

13. The method of claim 11, wherein irradiating light from the linear array of light-emitting elements further comprises:
    supplying a first drive current to each of the plurality of light-emitting elements in the middle portion; and
    supplying a second drive current to each of the plurality of light-emitting elements in the two end portions, wherein the first drive current is greater than the second drive current, and the first irradiance is greater than the second irradiance.

14. The method of claim 11, further comprising one or more of reflecting, refracting, and diffracting light from each of the plurality of light-emitting elements in the middle portion via optical elements, wherein each of the plurality of light-emitting elements in the middle portion comprises one of the optical elements, and wherein the first irradiance is greater than the second irradiance.

15. The method of claim 11, further comprising one or more of reflecting, refracting, and diffracting light from each of the plurality of light-emitting elements in the two end portions via optical elements, wherein each of the plurality of light-emitting elements in the end portions comprises one of the optical elements, and wherein the first irradiance is greater than the second irradiance.

16. A lighting system comprising,
a housing;
a window mounted in a front plane of the housing, a window length spanning a length of the front plane; and
a linear array of light-emitting elements enclosed within the housing and the window, the linear array aligned with and emitting light through a window front plane and window sidewalls, and the linear array spanning the window length, wherein
- first and last light-emitting elements of the linear array are positioned adjacent to widthwise edges of the window,
- the window sidewalls at the widthwise edges are aligned flush with housing sidewalls, the window sidewalls extending perpendicularly back from the front plane,
- the linear array of light-emitting elements comprises a middle portion in between two end portions, the linear array having only a single row of elements, wherein:
  - the middle portion comprises a plurality of light-emitting elements of the linear array are evenly distributed over the middle portion with a first spacing throughout the middle portion; and
  - each of the two end portions comprise a plurality of light-emitting elements of the linear array evenly distributed over the end portion with a second spacing throughout the end portion, the first spacing being greater than the second spacing; and
- a controller, including instructions executable to irradiate light having a first irradiance from the light-emitting elements distributed over the middle portion, and to irradiate light having a second irradiance from light-emitting elements distributed over the two end portions.

17. The method of claim 16, wherein the first irradiance is greater than the second irradiance.

18. The method of claim 16, wherein the window comprises a contiguous window covering the linear array of light-emitting elements through which the light-emitting elements of the linear array emit light.

19. The lighting system of claim 18, further comprising coupling optics, the coupling optics comprising first optical elements at each of the plurality of light-emitting elements in the middle portion and second optical elements at each of the plurality of light-emitting elements in the two end portions.

20. The lighting system of claim 18, wherein the cooling subsystem comprises a heat sink with cooling fins conductively attached to a back surface of the linear array of light-emitting elements, and a cooling fan.

\* \* \* \* \*